(12) United States Patent
Suzuki et al.

(10) Patent No.: US 12,090,864 B2
(45) Date of Patent: Sep. 17, 2024

(54) CONTROL DEVICE FOR PROTECTING POWER STORAGE DEVICE

(71) Applicant: DENSO CORPORATION, Kariya (JP)

(72) Inventors: Masaru Suzuki, Kariya (JP); Yasuhisa Kitagawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 330 days.

(21) Appl. No.: 17/730,600

(22) Filed: Apr. 27, 2022

(65) Prior Publication Data

US 2022/0250479 A1 Aug. 11, 2022

Related U.S. Application Data

(63) Continuation of application No. PCT/JP2020/040327, filed on Oct. 27, 2020.

(30) Foreign Application Priority Data

Oct. 29, 2019 (JP) .................................. 2019-196042
Apr. 28, 2020 (JP) .................................. 2020-079447

(51) Int. Cl.
| | |
|---|---|
| *B60L 50/60* | (2019.01) |
| *B60L 3/00* | (2019.01) |
| *B60L 58/12* | (2019.01) |
| *G01R 31/36* | (2020.01) |
| *G01R 31/396* | (2019.01) |

(52) U.S. Cl.
CPC ............ *B60L 3/0046* (2013.01); *B60L 3/0061* (2013.01); *B60L 50/60* (2019.02); *B60L 58/12* (2019.02); *G01R 31/3648* (2013.01); *G01R 31/396* (2019.01); *B60L 2210/40* (2013.01); *B60L 2220/10* (2013.01)

(58) Field of Classification Search
CPC ........... B60W 20/13; B60W 2510/244; B60W 2710/086; H01M 10/44; G05B 15/02; G05B 2219/25387
See application file for complete search history.

(56) References Cited

U.S. PATENT DOCUMENTS 9,272,701 B2 * 3/2016 Arai ........................ B60L 50/15
9,586,492 B2 * 3/2017 Chevalley ............... B60L 53/11
(Continued)

FOREIGN PATENT DOCUMENTS

JP 2761998 B2 6/1998

*Primary Examiner* — Dalena Tran
(74) *Attorney, Agent, or Firm* — Oliff PLC

(57) ABSTRACT

A control device includes a limit value calculation unit that, when a rotary electric machine is driven as an electric motor, subtracts a power consumption value from a discharge power limit value of a power storage device to calculate an input limit value, and a control unit that, when the rotary electric machine is driven as an electric motor, controls the inverter so that a power consumption value of the rotary electric machine is equal to or less than the input limit value. In response to an abnormality occurring wherein a normal power consumption value cannot be achieved when the rotary electric machine is driven as an electric motor, the limit value calculation unit sets the power consumption value of the electrical device for calculating the input limit value on an upper limit side of a range in which the power consumption value takes when the electrical device is driven.

8 Claims, 3 Drawing Sheets

(56) References Cited

U.S. PATENT DOCUMENTS

| | | | |
|---|---|---|---|
| 10,556,583 B2* | 2/2020 | Magarida | B60W 30/06 |
| 11,094,988 B2* | 8/2021 | Richter | B60K 6/48 |
| 2012/0187899 A1* | 7/2012 | Ozaki | B60L 50/61 |
| | | | 320/106 |
| 2016/0159337 A1* | 6/2016 | Hisano | B60K 6/20 |
| | | | 180/65.265 |

* cited by examiner

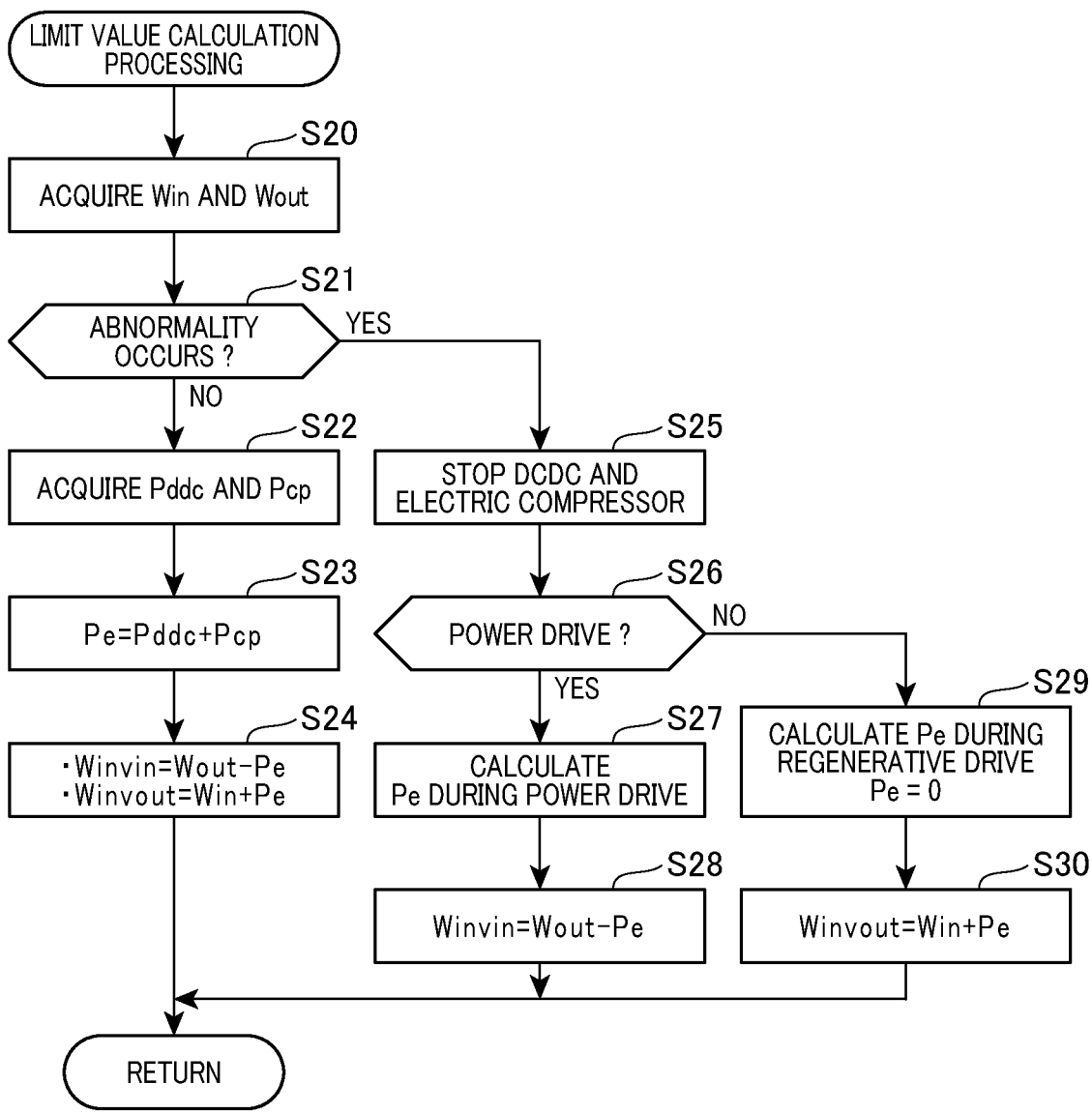

CONTROL DEVICE FOR PROTECTING POWER STORAGE DEVICE

CROSS-REFERENCE TO RELATED APPLICATION

This application is a continuation application of International Application No. PCT/JP2020/040327 filed Oct. 27, 2020 which designated the U.S. and claims priority to Japanese Patent Application No. 2019-196042 filed with the Japan Patent Office on Oct. 29, 2019, and Japanese Patent Application No. 2020-079447 filed with the Japan Patent Office on Apr. 28, 2020, the contents of each of which are incorporated herein by reference.

BACKGROUND

Technical Field

The present disclosure relates to a control device for protecting a power storage device.

Related Art

Conventionally, there is a known control device applied to a system including a power storage device, an inverter electrically connected to the power storage device, and a rotary electric machine electrically connected to the inverter. In order to protect the power storage device, the control device limits the power value supplied from the power storage device via the inverter to the rotary electric machine depending on the state of charge of the power storage device.

BRIEF DESCRIPTION OF THE DRAWINGS

In the accompanying drawings:

FIG. 3 is a flowchart showing the procedure of limit value calculation processing.

DESCRIPTION OF SPECIFIC EMBODIMENTS

Figure 1A:
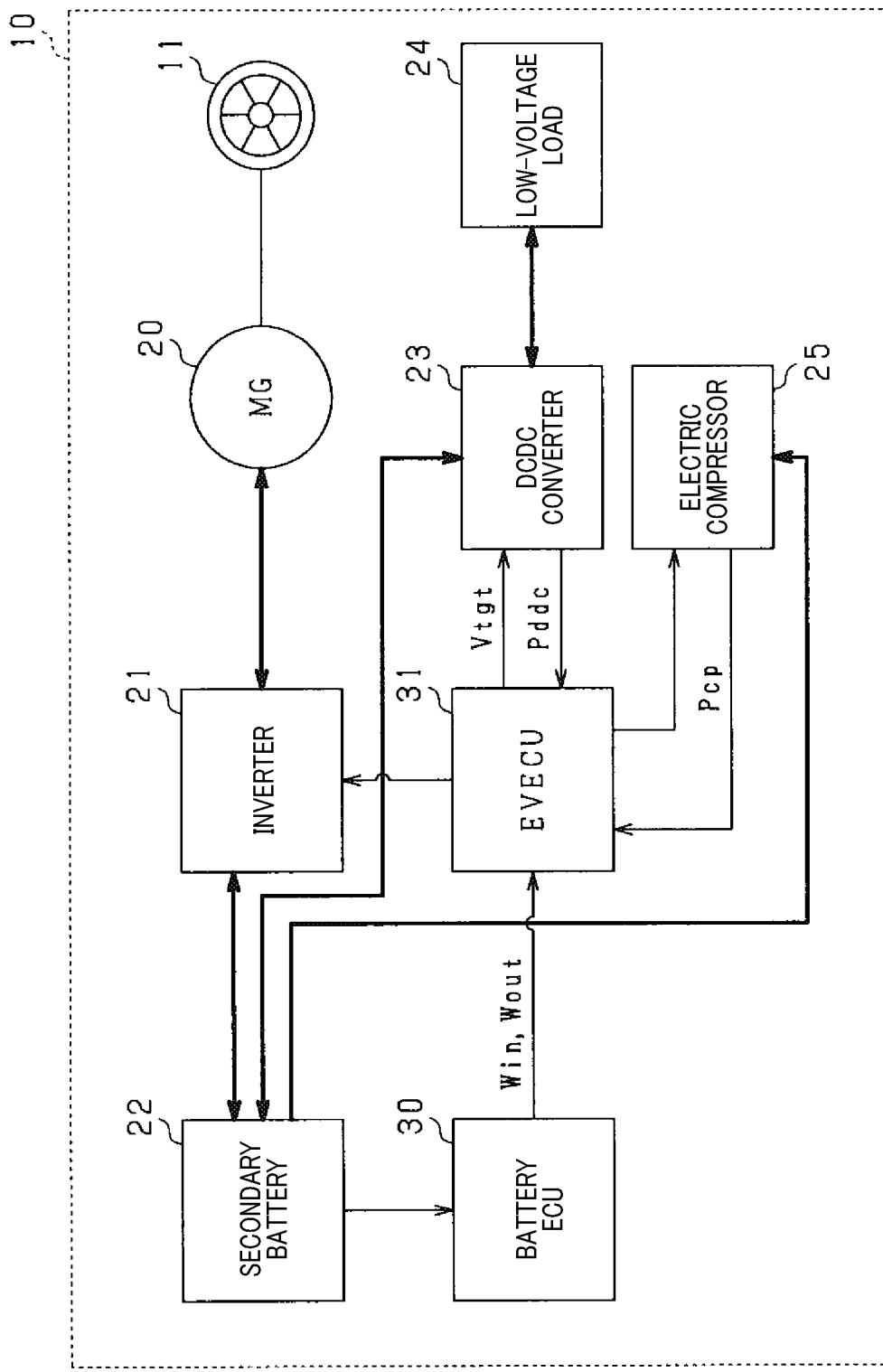
FIG. 1A is a whole schematic diagram of an in-vehicle system according to one embodiment.

As the above known system as disclosed in JP 2761998 B, there is one including an electrical device other than an inverter, the electrical device being electrically connected to a power storage device. In this system, in order to properly protect the power storage device, it is required to appropriately limit the transferred power value between the power storage device and the rotary electric machine via the inverter, in consideration of the power consumption value of the electrical device other than the inverter.

In view of the foregoing, it is desired to have a control device that can properly protect a power storage device.

A first aspect of the present disclosure provides a control device applied to a system including:

a power storage device,
an inverter electrically connected to the power storage device,
a rotary electric machine electrically connected to the inverter, and
an electrical device other than the inverter, the electrical device being electrically connected to the power storage device;

the control device including:

an acquisition unit that acquires a power consumption value of the electrical device,
a limit value calculation unit that, when the rotary electric machine is driven as an electric motor, subtracts the acquired power consumption value from a discharge power limit value of the power storage device to thereby calculate an input limit value, and
a control unit that, when the rotary electric machine is driven as an electric motor, controls the inverter so that a power consumption value of the rotary electric machine is equal to or less than the input limit value;
wherein in response to an abnormality occurring such that a normal power consumption value cannot be achieved by the acquisition unit when the rotary electric machine is driven as an electric motor, the limit value calculation unit sets the power consumption value of the electrical device used to calculate the input limit value on an upper limit side of a range in which the power consumption value can take when the electrical device is driven.

In the first aspect, when the rotary electric machine is driven as an electric motor, the limit value calculation unit subtracts the acquired power consumption value from a discharge power limit value of the power storage device to thereby calculate an input limit value. When the rotary electric machine is driven as an electric motor, the control unit controls the inverter so that the power consumption value of the rotary electric machine is equal to or less than the input limit value. This makes it possible to calculate an appropriate input limit value in consideration of the power consumption value of the electrical device, and to properly protect the power storage device from over discharge.

When the rotary electric machine is driven as an electric motor, an abnormality may occur such that a normal power consumption value cannot be achieved by the acquisition unit. In this respect, in the first disclosure, in response to the above abnormality occurring, the limit value calculation unit sets the power consumption value of the electrical device used to calculate the input limit value on an upper limit side of a range in which the power consumption value can take when the electrical device is driven. Therefore, even if the abnormality occurs, the actual discharge power value of the power storage device can be prevented from exceeding the discharge power limit value. As a result, the effect of protecting the power storage device can be increased.

In a second aspect of the present disclosure, when the rotary electric machine is driven as a power generator, the limit value calculation unit adds the acquired power consumption value to a charge power limit value of the power storage device to thereby calculate an output limit value, when the rotary electric machine is driven as a power generator, the control unit controls the inverter so that a power generation value of the rotary electric machine is equal to or less than the output limit value, and
in response to the abnormality occurring when the rotary electric machine is driven as a power generator, the limit value calculation unit sets the power consumption value of the electrical device used to calculate the output limit value on a lower limit side of the range.

According to the second disclosure, even if an abnormality occurs such that a normal power consumption value cannot be achieved by the acquisition unit, the actual charge power value of the power storage device can be prevented from exceeding the charge power limit value. As a result, the power storage device can be protected from over charge.

One embodiment that embodies the control device according to the present disclosure will be described below with reference to the drawings. The control device of the present embodiment is mounted in a vehicle, such as an electric vehicle including a rotary electric machine alone as a running power source.

As shown in FIG. 1A, a vehicle 10 includes a rotary electric machine 20, an inverter 21, and a high-voltage storage battery 22 as a power storage device. In the present embodiment, the rotary electric machine 20 has a three-phase winding, and is a permanent magnet synchronous machine, for example. The rotor of the rotary electric machine 20 is able to transmit power to a drive wheel 11 of the vehicle 10. That is, the rotary electric machine 20 serves as a running power source of the vehicle 10.

The inverter 21 is electrically connected to a stator winding of the rotary electric machine 20. The inverter 21 has upper and lower arm switches. The high-voltage storage battery 22 is an assembled battery including a plurality of serially connected cells, and is, for example, a secondary battery such as a lithium ion storage battery or a nickel-hydrogen storage battery.

The vehicle 10 includes a DC-DC converter 23, a low-voltage load 24, and an electric compressor 25. The DC-DC converter 23 lowers the output voltage of the high-voltage storage battery 22 and supplies it to the low-voltage load 24. The low-voltage load 24 contains, for example, at least one of a low-voltage storage battery and a low-voltage electrical load. The low-voltage storage battery is a storage battery with a lower output voltage than the high-voltage storage battery 22, and is a lead storage battery, for example.

The electric compressor 25 constitutes an in-vehicle air-conditioner, and is powered and driven by the high-voltage storage battery 22 to circulate the refrigerant in the in-vehicle refrigeration cycle. In the present embodiment, the DC-DC converter 23 and the electric compressor 25 correspond to the "electrical device."

The vehicle 10 includes a battery ECU 30 that monitors the high-voltage storage battery 22, and EV ECU 31. The battery ECU 30 detects the voltage of each cell in the high-voltage storage battery 22, and a battery temperature, which is the temperature of the high-voltage storage battery 22. The battery ECU 30 sets a discharge power limit value Wout and a charge power limit value Win of the high-voltage storage battery 22 based on the detected battery temperature. The limit values Wout and Win are stored, for example, as map information associated with the battery temperature in a memory as a storage unit provided in the battery ECU 30. The memory is a non-transitional substantive recording medium other than ROM (e.g., a non-volatile memory other than ROM). The battery ECU 30 sends the set limit values Wout and Win, and the detected voltage to the EV ECU 31.

The EV ECU 31 performs switching control of the upper and lower arm switches that constitute the inverter 21. Specifically, in order to rotate the rotor of the rotary electric machine 20 for running the vehicle 10, the EV ECU 31 performs power drive control, which is switching control to convert the DC power output from the high-voltage storage battery 22 into AC power and supply it to the rotary electric machine 20. Further, in order to charge the high-voltage storage battery 22 or supply power to the DC-DC converter 23 and the electric compressor 25, the EV ECU 31 performs regenerative drive control, which is switching control to convert the AC power generated by the rotary electric machine 20 into DC power and output it to the high-voltage storage battery 22 side.

The EV ECU 31 sends a target value Vtgt of the output voltage of the DC-DC converter 23 to the DC-DC converter 23. The DC-DC converter 23 thereby feedback-controls the own output voltage to the target value Vtgt. Further, the EV ECU 31 controls the drive of the electric compressor 25.

The DC-DC converter 23 has the function of calculating the own power consumption value Pddc, and sending the calculated power consumption value Pddc to the EV ECU 31. The electric compressor 25 has the function of calculating the own power consumption value Pcp, and sending the calculated power consumption value Pcp to the EV ECU 31.

Figure 2:
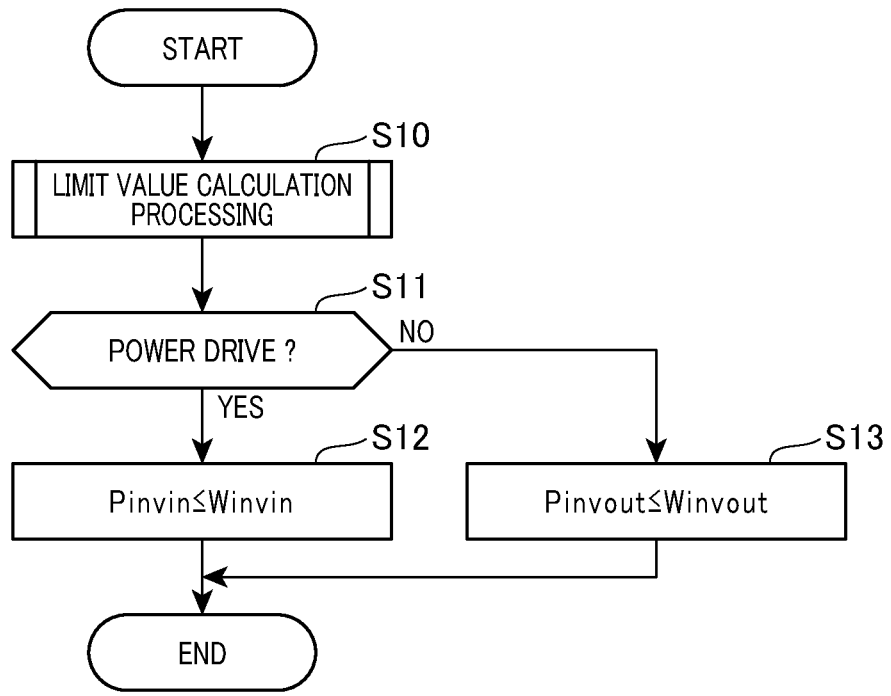
FIG. 2 is a flowchart showing the procedure of EV ECU processing.

Subsequently, the procedure of the processing executed by the EV ECU 31 will be shown using FIG. 2. This processing is repeatedly executed, for example, with a predetermined control cycle.

The EV ECU 31 may be mainly configured as a microcomputer, and the like, and include a CPU, a ROM, a RAM, a flash memory, an I/O, a bus line that connects these components, and the like. The EV ECU 31 performs the processing described below when a program stored in the ROM is executed.

Figure 1B:
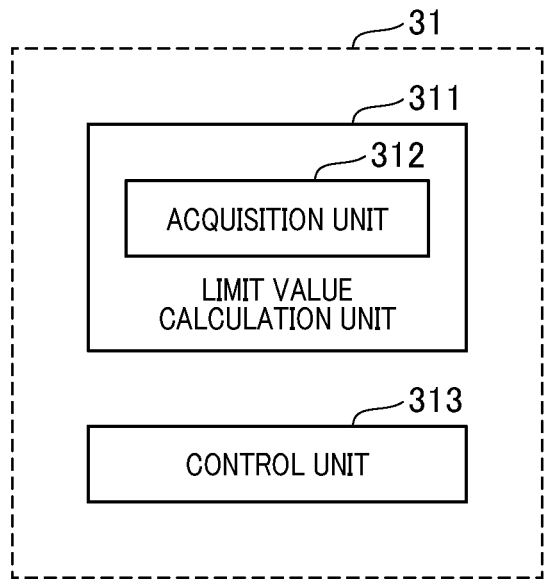
FIG. 1B is a functional block diagram of an EV ECU according to one embodiment.

As illustrated in FIG. 1B, the EV ECU 31, which corresponds to a control device, includes, as functional blocks, a limit value calculation unit 311 and a control unit 313. The functions of the functional blocks 311 and 313 may be implemented by the CPU executing the program. In the processing described below, the limit value calculation unit 311 is responsible for execution of step S10. The control unit 313 is responsible for execution of steps S11-S13.

In step S10, limit value calculation processing is performed to calculate an input limit value Winvin and an output limit value Winvout. The details of the processing will be described later.

In step S11, it is determined whether power drive control has been performed. When a positive determination is made in step S11, the processing proceeds to step S12, and switching control of the inverter 21 is performed so that a power consumption value Pinvin of the rotary electric machine 20 is less than the input limit value Winvin calculated in step S10. The power consumption value Pinvin of the rotary electric machine 20 is a power value supplied from the high-voltage storage battery 22 via the inverter 21 to the rotary electric machine 20.

When a negative determination is made in step S11, it is determined that regenerative drive control has been performed, and the processing proceeds to step S13. In step S13, switching control of the inverter 21 is performed so that a power generation value Pinvout of the rotary electric machine 20 is less than the output limit value Winvout calculated in step S10. The power generation value Pinvout of the rotary electric machine 20 is a power value output from the rotary electric machine 20 via the inverter 21 to the high-voltage storage battery 22 side.

FIG. 3 shows the procedure of limit value calculation processing.

In step S20, the charge power limit value Win and discharge power limit value Wout sent from the battery ECU 30 are acquired.

In step S21, it is determined whether an abnormality has occurred such that normal power consumption values Pddc and Pcp cannot be achieved from the DC-DC converter 23 and the electric compressor 25, respectively. In the present embodiment, the abnormality includes a communication abnormality between the DC-DC converter 23 and the EV ECU 31, and an abnormality in the function of calculating the power consumption value Pddc in the DC-DC converter 23, a communication abnormality between the electric compressor 25 and the EV ECU 31, and an abnormality in the function of calculating the power consumption value Pcp in the electric compressor 25.

When it is determined in step S21 that no abnormality has occurred, the processing proceeds to step S22, and the power consumption value Pddc sent from the DC-DC converter 23 and the power consumption value Pcp sent from the electric compressor 25 are acquired. The processing of step S22 corresponds to an acquisition unit 312 (see FIG. 1B).

In step S23, the acquired power consumption values Pddc and Pcp are added together to thereby calculate a device power consumption value Pe.

In step S24, the device power consumption value Pe (=Pddc+Pcp) calculated in step S23 is subtracted from the discharge power limit value Wout acquired in step S20 to thereby calculate an input limit value Winvin to be used in power drive control. Further, the device power consumption value Pe calculated in step S23 is added to the charge power limit value Win acquired in step S20 to thereby calculate an output limit value Winvout to be used in regenerative drive control.

When it is determined in step S21 that the abnormality has occurred, the processing proceeds to step S25. When the DC-DC converter 23 is being driven, a drive stop command for the DC-DC converter 23 is sent to the DC-DC converter 23. When the electric compressor 25 is being driven, a drive stop command for the electric compressor 25 is sent to the electric compressor 25.

In step S26, it is determined whether power drive control has been performed. When a positive determination is made in step S26, the processing proceeds to step S27. The calculation of the device power consumption value Pe uses a value on the upper limit side of a range in which the power consumption value Pddc can take when the DC-DC converter 23 is driven, and a value on the upper limit side of a range in which the power consumption value Pcp can take when the electric compressor 25 is driven. Specifically, an upper limit value Pmaxddc of the range in which the power consumption value Pddc can take when the DC-DC converter 23 is driven, and an upper limit value Pmaxcp of the range in which the power consumption value Pcp can take when the electric compressor 25 is driven are added together to thereby calculate a device power consumption value Pe. The upper limit value Pmaxddc of the DC-DC converter 23 is determined from the viewpoint that the DC-DC converter 23 is not broken, and the upper limit value Pmaxcp of the electric compressor 25 is determined from the viewpoint that the electric compressor 25 is not broken. In the present embodiment, the DC-DC converter 23 satisfies "0<Pddc≤Pmaxddc" during driving, and the electric compressor 25 satisfies "0<Pcp≤Pmaxcp" during driving. As the upper limit values Pmaxddc and Pmaxcp, values stored in the memory (e.g., fixed values) may be used. The device power consumption value Pe calculated by the processing of step S18 is a value calculated without using the power consumption values Pddc and Pcp sent from the DC-DC converter 23 and the electric compressor 25, respectively.

Thereafter, in step S28, the device power consumption value Pe (=Pmaxddc+Pmaxcp) calculated in step S27 is subtracted from the discharge power limit value Wout acquired in step S20 to thereby calculate an input limit value Winvin to be used in power drive control that is performed when an abnormality occurs.

When a negative determination is made in step S26, it is determined that regenerative drive control has been performed, and the processing proceeds to step S29. In step S29, the calculation of the device power consumption value Pe uses a value on the lower limit side of a range in which the power consumption value Pddc can take when the DC-DC converter 23 is driven, and a value on the lower limit side of a range in which the power consumption value Pcp can take when the electric compressor 25 is driven. Specifically, the power consumption values Pddc and Pcp used in the calculation are set to 0, and the device power consumption value Pe is set to 0. The device power consumption value Pe calculated by the processing of step S29 is a value calculated without using the power consumption values Pddc and Pcp sent from the DC-DC converter 23 and the electric compressor 25, respectively.

Thereafter, in step S30, the device power consumption value Pe calculated in step S29 is added to the charge power limit value Win acquired in step S20 to thereby calculate an output limit value Winvout to be used in regenerative drive control that is performed when an abnormality occurs. That is, the output limit value Winvout is the same value as the charge power limit value Win.

According to the present embodiment described in detail above, the following effects are obtained.

When power drive control is performed, if it is determined that an abnormality occurs such that normal power consumption values Pddc and Pcp cannot be achieved, the EV ECU 31 adds an upper limit value Pmaxddc of a range in which the power consumption value Pddc of the DC-DC converter 23 can take, and an upper limit value Pmaxcp of a range in which the power consumption value Pcp of the electric compressor 25 can take, thereby calculating an device power consumption value Pe. Then, the EV ECU 31 subtracts the calculated device power consumption value Pe (=Pmaxddc+Pmaxcp) from the acquired discharge power limit value Wout to thereby calculate an input limit value Winvin. This can properly prevent the actual discharge power value of the high-voltage storage battery 22 from exceeding the discharge power limit value Wout even if the abnormality occurs. As a result, it is possible to prevent over discharge of the high-voltage storage battery 22, and it is also possible to suppress the occurrence of a situation in which the vehicle 10 cannot travel.

When regenerative drive control is performed, if it is determined that an abnormality occurs such that normal power consumption values Pddc and Pcp cannot be achieved, the EV ECU 31 sets the device power consumption value Pe used to calculate the output limit value Winv to 0, and sets the output limit value Winvout to the same value as the charge power limit value Win. This can properly prevent the actual charge power value of the high-voltage storage battery 22 from exceeding the charge power limit value Win even if the abnormality occurs. As a result, it is possible to prevent over charge of the high-voltage storage battery 22.

When it is determined that the abnormality occurs, the EV ECU 31 outputs a drive stop command to, of the DC-DC converter 23 and the electric compressor 25, the one being driven. This can properly prevent over discharge or over charge of the high-voltage storage battery 22 if the abnormality occurs.

Even when a drive stop command is output in step S25, for example, if a communication abnormality occurs between the DC-DC converter 23 and the EV ECU 31, the DC-DC converter 23 cannot be stopped. Even in such a case, the processing of steps S26 to S30 can properly prevent over discharge or over charge of the high-voltage storage battery 22.

Other Embodiments

The above embodiment may be carried out with the following changes.

(O1) In step S25 of FIG. 3, the power consumption value may be lowered from before the abnormality occurs while continuing to drive the DC-DC converter 23 and the electric compressor 25, without stopping them.

(O2) The processing of step S25 may be omitted. In this case, the EV ECU 31 moves to step S26 when a positive determination is made in step S21.

(O3) In step S27, the value on the upper limit side of the range in which the power consumption value Pddc can take when the DC-DC converter 23 is driven may be a value slightly less than the upper limit value Pmaxddc of the DC-DC converter 23. Further, the value on the upper limit side of the range in which the power consumption value Pcp can take when the electric compressor 25 is driven may be a value slightly less than the upper limit value Pmaxcp of the electric compressor 25. In this case, in step S27, a value slightly less than the upper limit value Pmaxddc of the DC-DC converter 23 and a value slightly less than the upper limit value Pmaxcp of the electric compressor 25 may be added together to thereby calculate a device power consumption value Pe. In this case, the calculated device power consumption value Pe may be, for example, a value of 90% or more and less than 100% of "Pmaxddc+Pmaxcp," or a value of 95% or more and less than 100% of "Pmaxddc+Pmaxcp."

(O4) In step S29, the value on the lower limit side of the range in which the power consumption value Pddc can take when the DC-DC converter 23 is driven may be a value slightly larger than 0. Further, the value on the lower limit side of the range in which the power consumption value Pcp can take when the electric compressor 25 is driven may be a value slightly larger than 0. In this case, the device power consumption value Pe may be a value slightly larger than 0 in step S29. In this case, specifically, the calculated device power consumption value Pe may be, for example, a value larger than 0 and 10% or less of "Pmaxddc+Pmaxcp," or a value larger than 0 and 5% or less of "Pmaxddc+Pmaxcp."

(O5) The processing of step S27 or S28 in the power drive control, or the processing of step S29 or S30 in the regenerative drive control may be omitted.

(O6) The power storage device is not limited to a storage battery, but may be, for example, a high-capacity capacitor.

(O7) The inverter 21 and the high-voltage storage battery 22 may be electrically connected via a CDC converter different from the DC-DC converter 23. This DC-DC converter increases the output voltage of the high-voltage storage battery 22 and supplies it to the inverter 21, or lowers the voltage from the inverter 21 and supplies it to the high-voltage storage battery 22.

(O8) The control device can be mounted in a vehicle equipped with an in-wheel motor on the inner peripheral side of the drive wheel, or a vehicle equipped with an onboard motor on the vehicle body. Examples of the vehicle equipped with an onboard motor include vehicles with individual motors for each of the front and rear drive wheels, individual motors for each of the left and right drive wheels, a common motor for the two front wheels, or a common motor for the two rear wheels. In vehicles equipped with a plurality of motors as explained above, when a common high-voltage storage battery is provided for the inverter of each motor, the power consumption value Pinvin of step S12 in FIG. 2 may be, for example, a total value of power values supplied from the high-voltage storage battery via each inverter to each motor. Further, for example, the power generation value Pinvout of step S13 in FIG. 2 may be a total value of power values output from each motor via each inverter to the high-voltage storage battery.

(O9) The vehicle on which the control device is mounted is not limited to a vehicle including a rotary electric machine alone as a running power source, but may be a vehicle including an internal-combustion engine in addition to a rotary electric machine as running power sources.

Moreover, the mobile object on which the control device is mounted is not limited to a vehicle, and may be, for example, an aircraft including a rotary electric machine as a flight power source, or a ship including a rotary electric machine as a navigational power source.

(O10) The control device and the method thereof described in the present disclosure may be realized by a dedicated computer provided by configuring a processor and memory programmed to perform one or more functions embodied in a computer program. Alternatively, the control unit and the method thereof described in the present disclosure may be realized by a dedicated computer provided by configuring a processor with one or more dedicated hardware logic circuits. Alternatively, the control unit and the method thereof described in the present disclosure may be realized by one or more dedicated computers configured by a combination of a processor and memory programmed to perform one or more functions, and a processor configured with one or more hardware logic circuits. In addition, the computer program may be stored in a computer-readable, non-transitory tangible storage medium as instructions to be executed by a computer.

The present disclosure is described according to embodiments; however, it is understood that the present disclosure is not limited to the embodiments and configurations. The present disclosure also includes various modified examples and modifications within an equivalent range. In addition, various combinations and configurations, and other combinations and configurations including more, less, or only a single element, are also within the spirit and scope of the present disclosure.

What is claimed is:

1. A control device applied to a system comprising:
a power storage device,
an inverter electrically connected to the power storage device,
a rotary electric machine electrically connected to the inverter, and
an electrical device other than the inverter, the electrical device being electrically connected to the power storage device;
the control device comprising:
an acquisition unit that acquires a power consumption value of the electrical device,
a limit value calculation unit that, when the rotary electric machine is driven as an electric motor, subtracts the acquired power consumption value from a discharge power limit value of the power storage device to thereby calculate an input limit value, and
a control unit that, when the rotary electric machine is driven as an electric motor, controls the inverter so that a power consumption value of the rotary electric machine is equal to or less than the input limit value;

wherein in response to an abnormality occurring such that a normal power consumption value cannot be achieved by the acquisition unit when the rotary electric machine is driven as an electric motor, the limit value calculation unit sets the power consumption value of the electrical device used to calculate the input limit value on an upper limit side of a range in which the power consumption value can take when the electrical device is driven.

2. The control device according to claim 1, wherein when the rotary electric machine is driven as a power generator, the limit value calculation unit adds the acquired power consumption value to a charge power limit value of the power storage device to thereby calculate an output limit value, when the rotary electric machine is driven as a power generator, the control unit controls the inverter so that a power generation value of the rotary electric machine is equal to or less than the output limit value, and in response to the abnormality occurring when the rotary electric machine is driven as a power generator, the limit value calculation unit sets the power consumption value of the electrical device used to calculate the output limit value on a lower limit side of the range.

3. The control device according to claim 2, wherein in response to the abnormality occurring when the rotary electric machine is driven as a power generator, the limit value calculation unit sets the power consumption value of the electrical device used to calculate the output limit value to 0.

4. The control device according to claim 1, wherein in response to the abnormality occurring when the rotary electric machine is driven as an electric motor, the limit value calculation unit subtracts an upper limit value of the range from the discharge power limit value to thereby calculate the input limit value.

5. The control device according to claim 1, wherein in response to the abnormality occurring, the control unit reduces the power consumption value of the electrical device being driven.

6. A control device applied to a system comprising:
a power storage device,
an inverter electrically connected to the power storage device,
a rotary electric machine electrically connected to the inverter, and
an electrical device other than the inverter, the electrical device being electrically connected to the power storage device;
the control device comprising:
an acquisition unit that acquires a power consumption value of the electrical device,
a limit value calculation unit that, when the rotary electric machine is driven as a power generator, adds the acquired power consumption value to a charge power limit value of the power storage device to thereby calculate an output limit value, and
a control unit that, when the rotary electric machine is driven as a power generator, controls the inverter so that a power generation value of the rotary electric machine is equal to or less than the output limit value;
wherein in response to an abnormality occurring such that a normal power consumption value cannot be achieved by the acquisition unit when the rotary electric machine is driven as a power generator, the limit value calculation unit sets the power consumption value of the electrical device used to calculate the output limit value on a lower limit side of a range in which the power consumption value can take when the electrical device is driven.

7. The control device according to claim 6, wherein in response to the abnormality occurring when the rotary electric machine is driven as a power generator, the limit value calculation unit sets the power consumption value of the electrical device used to calculate the output limit value to 0.

8. The control device according to claim 6, wherein in response to the abnormality occurring, the control unit reduces the power consumption value of the electrical device being driven.

* * * * *